United States Patent

Bewley

[11] Patent Number: 5,932,937
[45] Date of Patent: Aug. 3, 1999

[54] POWER CONTROL SYSTEM

[75] Inventor: Mark E. Bewley, San Antonio, Tex.

[73] Assignee: Lancer Partnership, Ltd., San Antonio, Tex.

[21] Appl. No.: 09/052,572

[22] Filed: Mar. 31, 1998

[51] Int. Cl.$^6$ ................................................. H01H 35/00
[52] U.S. Cl. ........................ 307/118; 307/125; 307/139; 187/386
[58] Field of Search ........................... 307/116, 139, 307/140, 118, 125; 392/326; 327/518; 137/386; 62/59

[56] References Cited

U.S. PATENT DOCUMENTS

| | | | |
|---|---|---|---|
| 3,576,485 | 4/1971 | Coons | 318/434 |
| 3,777,187 | 12/1973 | Kohn | 327/518 |
| 3,780,261 | 12/1973 | Eaton-Williams | 392/326 |
| 4,211,207 | 7/1980 | Molivadas | 126/587 |
| 4,907,417 | 3/1990 | Forsythe | 62/59 |

*Primary Examiner*—Albert W. Paladini
*Attorney, Agent, or Firm*—Christopher L. Makay

[57] ABSTRACT

A power control system includes a sensing device, a switch, a controller, a first circuit, and a second circuit. The sensing device determines whether a first predetermined condition or a second predetermined condition has occurred. The controller closes the switch responsive to a signal received from the sensing device indicating the occurrence of the first predetermined condition and opens the switch responsive to a signal received from the sensing device indicating the occurrence of the second predetermined condition. When the switch is open, the first circuit is enabled to apply power to the controller and prevent the application of power to a device. When the switch is closed, the second circuit is enabled to apply power to the controller and permit the application of power to the device.

7 Claims, 1 Drawing Sheet

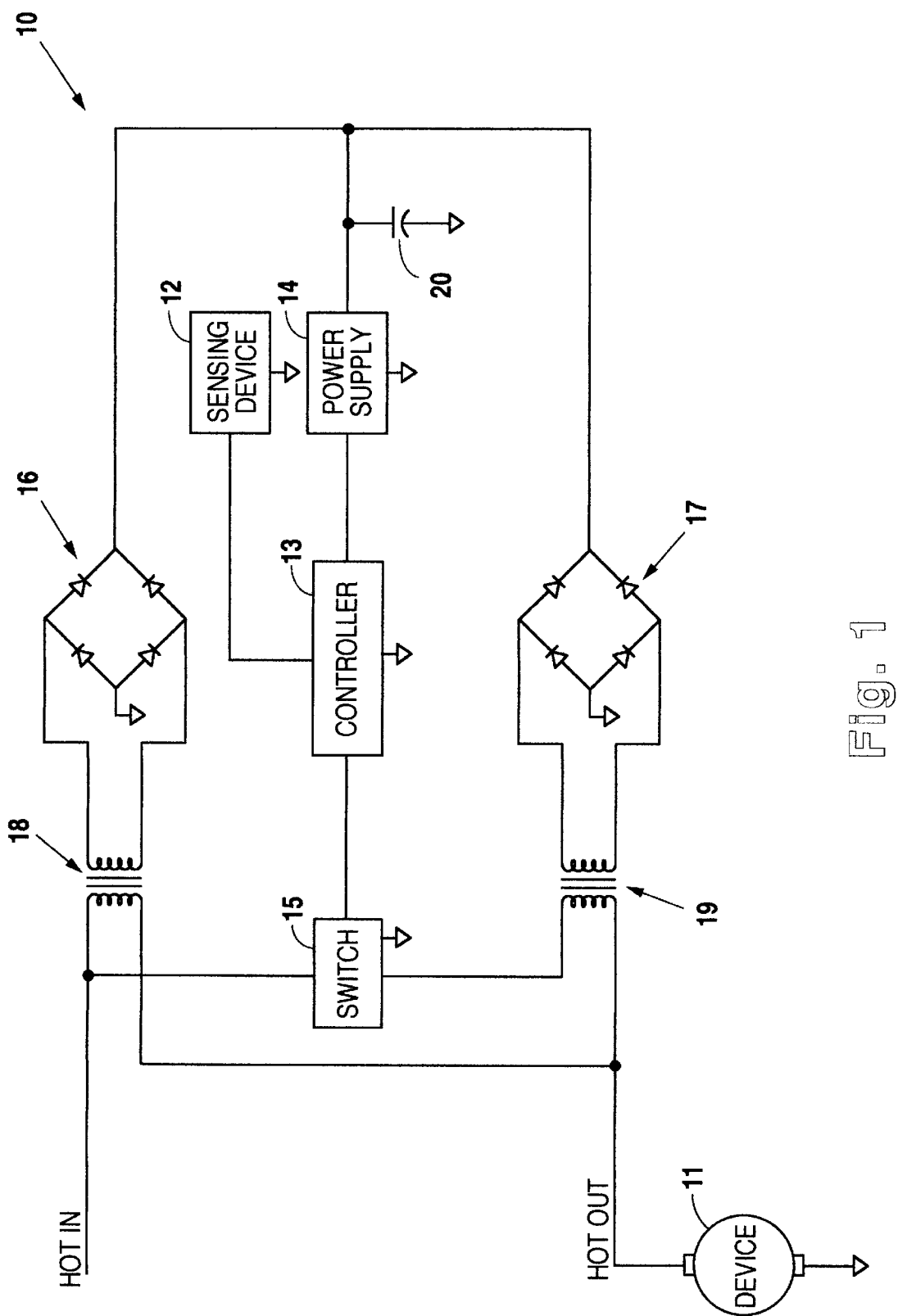

POWER CONTROL SYSTEM

BACKGROUND OF THE INVENTION

1. Field of the Invention

The present invention relates to power control systems and, more particularly, but not by way of limitation to an electronic power control system for motors such as compressor motors, pump motors, fan motors and the like.

2. Description of the Related Art

A typical power control system is mechanical and includes a sensor and a relay responsive to the sensor for delivering power to a motor. Sensors commonly employed in power control systems include ice bank sensors, liquid level sensors, pressure sensors, temperature sensors, and the like. Upon the detection of a first predetermined condition, such as a low liquid level or a certain temperature, the sensor outputs a signal that actuates the relay, thereby mechanically closing the contacts of the relay to connect the motor to a power source. The relay remains actuated and the motor continues to run until the sensor detects a second predetermined condition, such as a full liquid level or desired temperature. When the sensor detects the second predetermined condition, it ceases outputting its signal, resulting in the contacts of the relay opening to remove power from the motor.

Although the above mechanical power control system operates adequately, it suffers a significant disadvantage in that its relay is subject to malfunction. The relay typically malfunctions due to the fusing of its contacts, which means the motor receives power regardless of the signal output by the sensing device. As a result, the motor runs continuously, which burns out the motor and possibly damages the entire system. Furthermore, a system malfunction producing an accident may occur. Consequently, a mechanical power control system is unreliable and often results in a situation where all or part of an entire system must be unnecessarily replaced.

Accordingly, an electrical power control system that eliminates the unreliability associated with relays will significantly improve over current mechanical power control systems.

SUMMARY OF THE INVENTION

In accordance with the present invention, a power control system includes a sensing device, a switch, a controller, a first circuit, and a second circuit. The sensing device determines whether a first predetermined condition or a second predetermined condition has occurred. The controller closes the switch responsive to a signal received from the sensing device indicating the occurrence of the first predetermined condition and opens the switch responsive to a signal received from the sensing device indicating the occurrence of the second predetermined condition.

When the switch is open, the first circuit is enabled to apply power to the controller and prevent the application of power to a device. The first circuit includes a power supply for delivering regulated voltage to the controller, a rectifier circuit for delivering rectified voltage to the power supply, and a transformer for delivering stepped down voltage to the rectifier circuit. The rectifier circuit includes a bridge rectifier and a capacitor.

When the switch is closed, the second circuit is enabled to apply power to the controller and permit the application of power to the device. The second circuit includes a power supply for delivering regulated voltage to the controller, a rectifier circuit for delivering rectified voltage to the power supply, and a transformer for delivering stepped up voltage to the rectifier circuit. The rectifier circuit includes a bridge rectifier and a capacitor.

It is therefore an object of the present invention to provide an electronic power control system to regulate the application of power to a device.

Still other objects, features, and advantages of the present invention will become evident to those of ordinary skill in the art in light of the following.

BRIEF DESCRIPTION OF THE DRAWING

FIG. 1 is a schematic diagram illustrating a power control system according to the preferred embodiment.

DETAILED DESCRIPTION OF THE PREFERRED EMBODIMENT

As illustrated in FIG. 1, a power control system 10 regulates the power delivered to a device 11, which, in this preferred embodiment, may be a motor such as a compressor motor, a pump motor, a fan motor, and the like. The power control system 10 includes a sensing device 12, a controller 13, a power supply 14, a switch 15, bridge rectifiers 16 and 17, transformers 18 and 19, and capacitor 20.

The sensing device 12 is any suitable sensor and associated circuitry well-known to those of ordinary skill in the art, such as an ice bank size sensor, a liquid level sensor utilized in a carbonator, a pressure sensor for determining pressure differentials, a temperature sensor for measuring temperature changes, and the like. The sensing device 12 monitors a system or apparatus for a first predetermined condition, such as an ice bank melting to a lower limit, the liquid level of a carbonator dropping to a lower limit, or a temperature or pressure reaching a specified level.

Upon the detection of the first predetermined condition, the sensing device 12 outputs a signal to the controller 13. The sensing device 12 maintains that signal until it senses a second predetermined condition, such as an ice bank freezing to a desired size, the liquid level in a carbonator reaching a desired level, or a temperature or pressure reaching a desired level. After sensing the second predetermined condition, the sensing device 12 ceases outputting its signal or, alternatively, it outputs a second signal indicating to the controller 13 that the second predetermined condition has been satisfied.

The controller 13 controls the opening and the closing of the switch 15 in response to the output of the sensing device 12. In this preferred embodiment, the controller 13 is any suitable microcontroller such as a Motorola microcontroller, Part No. MC68HC705JJ7, while the switch 15 is any suitable electronic switch such as a triac. As long as the sensing device 12 indicates the first predetermined condition has not occurred, the controller 13 maintains the switch 15 open to ensure the device 11 remains deactivated.

With the switch 15 open, the transformer 19 is removed from the power control system 10 so that the transformer 18 receives and drops substantially all input voltage. The transformer 18 connects at its input winding across the input and output sides of a well-known power source such as a standard 115 VAC supply line. The output winding of the transformer 18 connects to the input side of the bridge rectifier 16, which, in this preferred embodiment, is a bridge rectifier well-known to those of ordinary skill in the art. The output side of the bridge rectifier 16 connects to the power supply 14 and the capacitor 20.

The transformer 18 steps down its 115 VAC input signal to deliver an approximately 12 VAC signal to the bridge rectifier 16. The bridge rectifier 16 rectifies the approximately 12 VAC signal, and the capacitor 20 smooths the rectified, approximately 12V voltage signal to provide the power supply 14 with an approximately 12 VDC signal. In this preferred embodiment, the transformer 18 provides a high impedance as compared to the impedance of the device 11 so that the transformer 18 drops substantially all of the voltage output by the power source. As a result, the device 11 receives insufficient voltage for activation and, thus, remains deactivated as long as the switch 15 remains open.

The power supply 14 regulates its 12 VDC input to provide the controller 13 with its required 5 VDC input signal. In this preferred embodiment, the power supply 14 is a power supply well known to those of ordinary skill in the art.

When the sensing device 12 senses the first predetermined condition, it outputs a signal to the controller 13 which, in turn, outputs a signal that closes the switch 15. The closing of the switch 15 connects the input winding of the transformer 19 across the input and output sides of the power source. In this preferred embodiment, the transformer 19 provides a low impedance as compared to the impedance of the transformer 18 so that the transformer 19 effectively shorts out the transformer 18, thereby removing the transformer 18 from the power control system 10.

In this preferred embodiment, the transformer 19 also provides a low impedance as compared to the impedance of the device 11 so that the device 11 drops a substantial portion of the voltage output by the power source. As a result, the device 11 is activated and remains activated as long as the switch 15 remains closed. Although the device 11 drops a substantial portion of the voltage delivered from the power source, the transformer 19 drops an amount of voltage sufficient to allow step up of that voltage by the transformer 19 to an approximately 20 VAC signal delivered from its output winding.

The output winding of the transformer 19 connects to the input side of the bridge rectifier 17, which, in this preferred embodiment, is a bridge rectifier well-known to those of ordinary skill in the art. The output side of the bridge rectifier 17 connects to the power supply 14 and the capacitor 20, which is common to both the bridge rectifier 16 and the bridge rectifier 17. The bridge rectifier 17 rectifies the approximately 20 VAC signal received from the transformer 19, and the capacitor 20 smooths the rectified, approximately 20V voltage signal to provide the power supply 14 with an approximately 20 VDC signal.

The power supply 14 regulates its 20 VDC input to provide the controller 13 with its required 5 VDC input signal. Thus, although the transformer 18 has effectively been removed from the power control system 10, the controller 13 still receives a voltage signal from the power supply 14 via the transformer 19, the bridge rectifier 17, and the capacitor 20.

The controller 13 maintains the switch 15 closed as long as the sensing device 12 does not measure a second predetermined condition. Upon measuring the second predetermined condition, the sensing device 12 either ceases outputting its signal to the controller 13 or outputs to the controller 13 a signal indicating satisfaction of the second predetermined condition. In response, the controller 13 opens the switch 15 to remove the transformer 19 from the power control system 10, thereby placing the transformer 18 back into the power supply system 10, resulting in the device 11 deactivating as previously described.

Although the present invention has been described in terms of the foregoing embodiment, such description has been for exemplary purposes only, and, as will be apparent to those of ordinary skill in the art, many alternatives, equivalents, and variations of varying degrees will fall within the scope of the present invention. That scope, accordingly, is not to be limited in any respect by the foregoing description, rather, it is defined only by the claims that follow.

We claim:

1. A power control system, comprising:

a sensing device for determining the occurrence of a first predetermined condition and a second predetermined condition;

a switch;

a controller that closes the switch responsive to a signal received from the sensing device indicating the occurrence of the first predetermined condition and that opens the switch responsive to a signal received from the sensing device indicating the occurrence of the second predetermined condition;

a first circuit coupled to a power source and the controller and enabled when the switch is open to apply power to the controller wherein the first circuit prevents the application of power to a device; and a second circuit coupled to the power source and the controller and enabled when the switch is closed to apply power to the controller wherein the second circuit permits the application of power to the device.

2. The power control system according to claim 1 wherein the switch comprises an electronic switch.

3. The power control system according to claim 1 wherein the controller comprises a microcontroller.

4. The power control system according to claim 1 wherein the first circuit comprises:

a power supply for delivering regulated voltage to the controller;

a rectifier circuit for delivering rectified voltage to the power supply; and a transformer for delivering stepped down voltage to the rectifier circuit.

5. The power control system according to claim 4 wherein the rectifier circuit comprises a bridge rectifier and a capacitor.

6. The power control system according to claim 1 wherein the second circuit comprises:

a power supply for delivering regulated voltage to the controller;

a rectifier circuit for delivering rectified voltage to the power supply; and a transformer for delivering stepped up voltage to the rectifier circuit.

7. The power control system according to claim 6 wherein the rectifier circuit comprises a bridge rectifier and a capacitor.

* * * * *